United States Patent
Nagoya

(10) Patent No.: US 6,526,534 B1
(45) Date of Patent: Feb. 25, 2003

(54) COMMUNICATION ELEMENT AND COMMUNICATION APPARATUS USING THE SAME

(75) Inventor: Mitsugu Nagoya, Tokyo (JP)

(73) Assignee: Duaxes Corporation, Tokyo (JP)

( * ) Notice: Subject to any disclaimer, the term of this patent is extended or adjusted under 35 U.S.C. 154(b) by 0 days.

(21) Appl. No.: 09/475,270

(22) Filed: Dec. 30, 1999

(30) Foreign Application Priority Data

Jan. 11, 1999 (JP) .......................................... 11-003942

(51) Int. Cl.[7] .............................................. G01R 31/28
(52) U.S. Cl. ...................................................... 714/727
(58) Field of Search ................................. 714/726–727

(56) References Cited

U.S. PATENT DOCUMENTS 5,546,406 A * 8/1996 Gillenwater et al. ........ 714/733

OTHER PUBLICATIONS

Maunder et al., Testability on TAP, IEEE, pp. 34–37 Feb. 1992.*

* cited by examiner

*Primary Examiner*—Albert Decady
*Assistant Examiner*—Shelly A Chase
(74) *Attorney, Agent, or Firm*—Kanesaka & Takeuchi

(57) ABSTRACT

A communication element having a plurality of input-side boundary cells and output-side boundary cells, and a TAP circuit for controlling the input and output of data to/from said input-side and output-side boundary cells, in which the input-side boundary cells are connected in parallel to said corresponding output-side boundary cells through the TAP circuit, and a communication apparatus having a plurality of the communication elements, terminal equipments separately connected to each of said communication elements, for inputting and outputting the data to/from said communication elements through said data input and output lines; and a host computer, in which the communication elements are connected in series to the host computer.

4 Claims, 3 Drawing Sheets

COMMUNICATION ELEMENT AND COMMUNICATION APPARATUS USING THE SAME

FIELD OF ART

The present invention relates to a communication element, which a boundary scan element for use in a wiring check for an electronic circuit substrate is applied to, and a communication apparatus using the same.

BACKGROUND ART

A boundary scan test method is proposed as a method of checking whether or not ICs packaged in an electronic circuit substrate are properly interconnected or whether or not an internal processing is properly executed in the ICs themselves.

This boundary scan test method is the test method which is applied to the electronic circuit substrate comprising the ICs in which a boundary scan element is previously incorporated. This boundary scan test method has a feature that connection check or IC operation test for an circuit substrate having such a high density that a so-called in-circuit test method cannot be employed can be performed.

An example of the conventional boundary scan element is now outlined.

FIG. 3 is a block diagram of a logic IC 100 to be tested comprising the boundary scan element.

The IC 100 comprises input terminals 101, output terminals 102 and an internal logic 111, as a basic constitution. The IC 100 further comprises the boundary scan element. The boundary scan element comprises input-side boundary cells 103, output-side boundary cells 104, a TDI terminal 105 to which data is inputted, a TDO terminal 106 from which the data is outputted, a TMS terminal 107 to which a signal for switching operation modes is inputted, a TCK terminal 108 to which a clock signal is inputted, a TRS terminal 109 to which a reset signal is inputted and a TAP circuit 110.

The input-side and output-side boundary cells 103 and 104 are separately provided for the respective input and output terminals 101 and 102. All the boundary cells 103 and 104 are connected in series in chain together.

The TDI terminal 105 and the TDO terminal 106 are connected to the input-side boundary cell 103 and the output-side boundary cell 104, respectively, of the boundary cells 103 and 104 located at both the ends.

While the TAP circuit 110 is synchronized to the clock signal from the TCK terminal 108, the TAP circuit 110 executes the processing in accordance with the signal for switching the operation modes from the TMS terminal 107. That is, the data is shifted to the boundary cells 103 and 104, or the data is inputted and outputted between the boundary cells 103 and 104 and the internal logic 111 or the input or output terminals 101 or 102. The TAP circuit 110 enters a reset state in accordance with the reset signal from the TRS terminal 109. This TRS terminal 109 is not always needed because the reset state can be included in one of commands to switch the operation modes from the TMS terminal 107.

In the method of testing the IC 100 comprising such a constitution, the operation test for the IC is performed, e.g., as follows: test data is inputted from a host computer to the TDI terminal 105 in a serial form, and the test data is shifted and set to each of the input-side boundary cells 103. Then, the set test data is outputted to and processed by the internal logic 111. Subsequently, the data from the internal logic 111 is set to the output-side boundary cells 104, and this data is then returned from the TDO terminal 106 to the host computer in the serial form. The host computer compares the returned data with the test data which the host computer previously sent out, whereby the host computer can distinguish whether or not the internal logic 111 normally operates.

The test for the connection between the ICs is carried out, e.g., as follows: the test data is sent and set from the host computer to the output-side boundary cells 104 through the TDI terminal 105 and the input-side boundary cells 103. This data is sent out from the output terminals 102 to another IC connected to the output terminals 102 of the IC 100.

Then, the host computer compares the test data which another IC received with the test data which the host computer had previously sent out, whereby the host computer can distinguish whether the wiring between the ICs is connected or disconnected, or the like.

On the other hand, the inventor has focused on the usefulness of the boundary scan element not as the element only for checking the wiring connection or the like but as a communication element for controlling various terminal equipment such as a CCD camera. The inventor has therefore proposed a communication apparatus in which this boundary scan element is applied to the communication element (International Publication No. WO98/55925).

However, the conventional boundary scan element is not satisfactory in a data transfer rate as the communication element.

That is, the conventional boundary scan element has a problem as follows: in order to set the data inputted from the TDI terminal 105 to each of the boundary cells 103 or 104, the data in each of the individual boundary cells 103 or 104 must be shifted sequentially.

This problem is similarly caused when the data set in the boundary cells 103 or 104 is outputted from the TDO terminal 106. The data transfer rate is not sufficient, particularly in the case of a large number of boundary cells 103 and 104.

It is therefore an object of the present invention to provide a communication element, which the boundary scan element is applied to and which can increase the data transfer rate, and a communication apparatus using the same.

DISCLOSURE OF THE INVENTION

According to the present invention, there is provided a communication element which comprises a plurality of input-side boundary cells; a plurality of output-side boundary cells corresponding to the input-side boundary cells; and a TAP circuit for controlling the input and output of data to/from the input-side and output-side boundary cells, the TAP circuit being connected to a TCK line to which a clock signal is inputted, a TMS line to which a mode signal for switching operation modes is inputted, and data input and output lines for inputting and outputting the data to/from terminal equipment which is an object of communication, wherein the input-side boundary cells are connected in parallel to the corresponding output-side boundary cells through the TAP circuit.

In this element, the boundary cells are not connected in series in chain together like the prior art, but the input-side boundary cells are connected in parallel to the corresponding output-side boundary cells through the TAP circuit.

Thus, the data stored in the input-side boundary cells can be transferred to the corresponding output-side boundary cells by one processing. Consequently, a data transfer rate can be increased.

In the communication element of the present invention, the boundary cells are not connected in series. To input or output the data between the communication element and the host computer or the like, the data is thus inputted or outputted directly to/from the boundary cells in a parallel form, not in a serial form through a TDI or TDO terminal like the prior art.

According to the present invention, there is provided a communication apparatus, which comprises a plurality of communication elements of the present invention; terminal equipment separately connected to each of the communication elements, for inputting and outputting the data to/from the communication elements through the data input and output lines; and a host computer, wherein the communication elements are connected in series manner to the host computer.

According to this means, the use of the communication element of the present invention allows increasing the data transfer rate at which the data is transferred between the communication elements and between the communication element and the host computer. Thus, the large amount of data can be processed. In the present invention, the terminal equipment means the object which the communication apparatus of the present invention communicates with. For example, a monitoring apparatus installed in every floor or room of a building, a security apparatus or various robots in a production line correspond to this terminal equipment. Since the communication apparatus of the present invention can transfer the data at high rate, the terminal equipment requiring the large-capacity data, in particular, can be also the object of communication.

PREFERRED EMBODIMENTS OF THE INVENTION

A preferred embodiment of the present invention will be described below with reference to the accompanying drawings.

Figure 1:
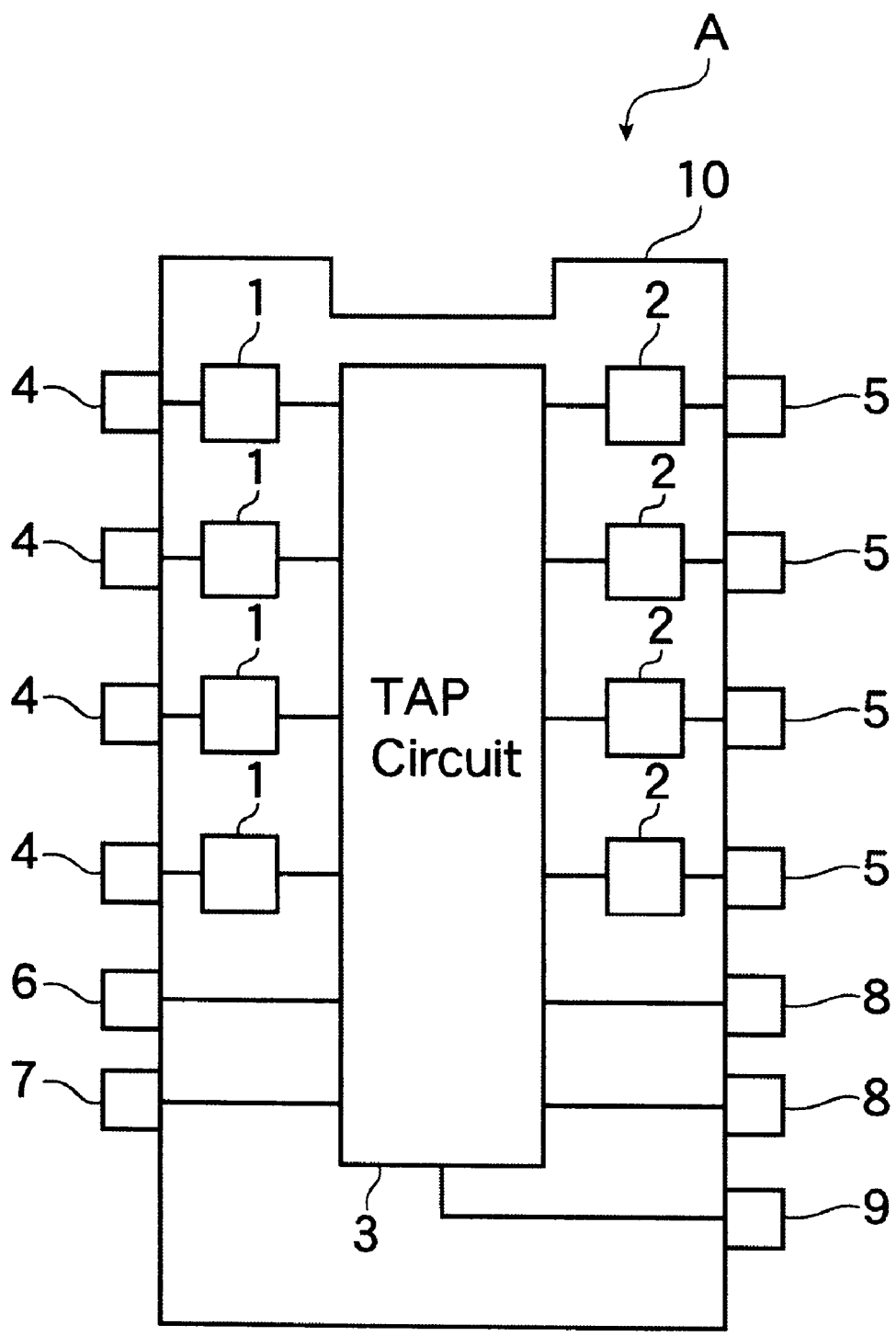
FIG. 1 is a block diagram of a communication element A according to the present invention.

FIG. 1 is a block diagram of a communication element A in which the communication element of the present invention is packaged.

The communication element A comprises input-side boundary cells 1, output-side boundary cells 2, a TAP circuit 3 and a package 10 in which these components are incorporated.

Each of the input-side boundary cells 1 is separately connected to each of external input terminals 4. The input-side boundary cells 1 can receive data inputted to the input terminals 4.

Output-side boundary cells 2 are provided, the number of which is the same as that of the input-side boundary cells 1. Each of the output-side boundary cells 2 is separately connected to each of external output terminals 5. The data set in the output-side boundary cells 2 can be outputted from the output terminals 5.

The example in FIG. 1 has four (4-bit) input-side boundary cells 1and four (4-bit) output-side boundary cells 2. However, the number of the boundary cells 1 and 2 is not limited to four. As far as the number of the input-side boundary cells 1 is the same as the number of the output-side boundary cells 2, the input-side and output-side boundary cells 1 and 2 may be increased in accordance with the number of the input and output terminals 4 and 5.

One input-side boundary cell 1 corresponds to one output-side boundary cell 2. Each of the input-side boundary cells 1 is connected in parallel to each of the output-side boundary cells 2 through the TAP circuit 3. Therefore, unlike the prior art, the input-side boundary cells 1 are not connected to each other, and the output-side boundary cells 2 are not connected to each other.

The TAP circuit 3 is connected to an external TCK terminal 6 and an-external TMS terminal 7. The TAP circuit 3 executes each processing in synchronization with a clock signal inputted from the TCK terminal 6. Operation modes of the TAP circuit 3 are switched in accordance with a mode signal inputted from the TMS terminal 7.

The TAP circuit 3 is also connected to external terminal-equipment-side input terminals 8 and an external terminal-equipment-side output terminal 9. These terminal-equipment-side input and output terminals 8 and 9 are connected to terminal equipment which is an object of communication. The TAP circuit 3 can send out the data for controlling the terminal equipment through the terminal-equipment-side output terminal 9 or the TAP circuit 3 can receive the data obtained by the terminal equipment through the terminal-equipment-side input terminals 8.

The example in FIG. 1 has two (2-bit) terminal-equipment-side input terminals 8 and one (1-bit) terminal-equipment-side output terminal 9. However, the number of the input and output terminals 8 and 9 is not limited to these numbers. Moreover, unlike this example, the number of the input and output terminals 8 and 9 does not have to be equal to the number of the boundary cells 1 and 2.

Subsequently, a function of the communication element A comprising such a constitution will be described.

The data as to the boundary cells 1 and 2 of the communication element A is inputted and outputted in a parallel form, not in a serial form. That is, the input data is inputted to each input terminal 4 as parallel data (4 bits), and the output data is also outputted from each output terminal 5 as the parallel data (4 bits). The communication element A has the following functions due to the operation modes of the TAP circuit 3.

A first function is to store the data inputted to the input terminals 4 in the input-side boundary cells 1. A second function is to output the data stored in the output-side boundary cells 2 from the output terminals 5. A third function is to transfer the data stored in the input-side boundary cells 1 to the output-side boundary cells 2. A fourth function is that the data having the controlled number of bits for controlling the terminal equipment or for other purposes is generated by the TAP circuit 3 in accordance with the data stored in the input-side boundary cells 1 and then this data is outputted from the terminal-equipment-side output terminal 9. A fifth function is that the TAP circuit 3 controls the number of bits of the data obtained from the terminal-equipment-side input terminals 8 and then the data is transferred to the output-side boundary cells 2.

The communication element A is particularly characterized by the third function. That is, the data can be transferred by one processing because the input-side boundary cells 1 are connected in parallel to the output-side boundary cells 2. Compared to a transfer rate of a conventional boundary scan element, the transfer rate of the communication element A is thus increased as the number of the boundary cells is increased. The larger the number of the boundary cells is, the greater a difference in a processing rate is. As a result, a feature of the communication element A is remarkably exhibited.

The number of bits is controlled as the fourth function because although the data obtained from the input-side boundary cells 1 is composed of 4 bits, the terminal-equipment-side output terminal 9 is composed of 1 bit. When the number of bits of the boundary cell 1 is the same as the number of bits of the output terminal 9, it is not necessary to control the number of bits. The number of bits is controlled as the fifth function for the same reason. In this case, the terminal-equipment-side input terminals 8 are composed of 2 bits and the output-side boundary cells 2 are composed of 4 bits. Thus, two pieces of data inputted to the terminal-equipment-side input terminals 8 can be stored as a piece of data in the output-side boundary cells 2.

Figure 2:
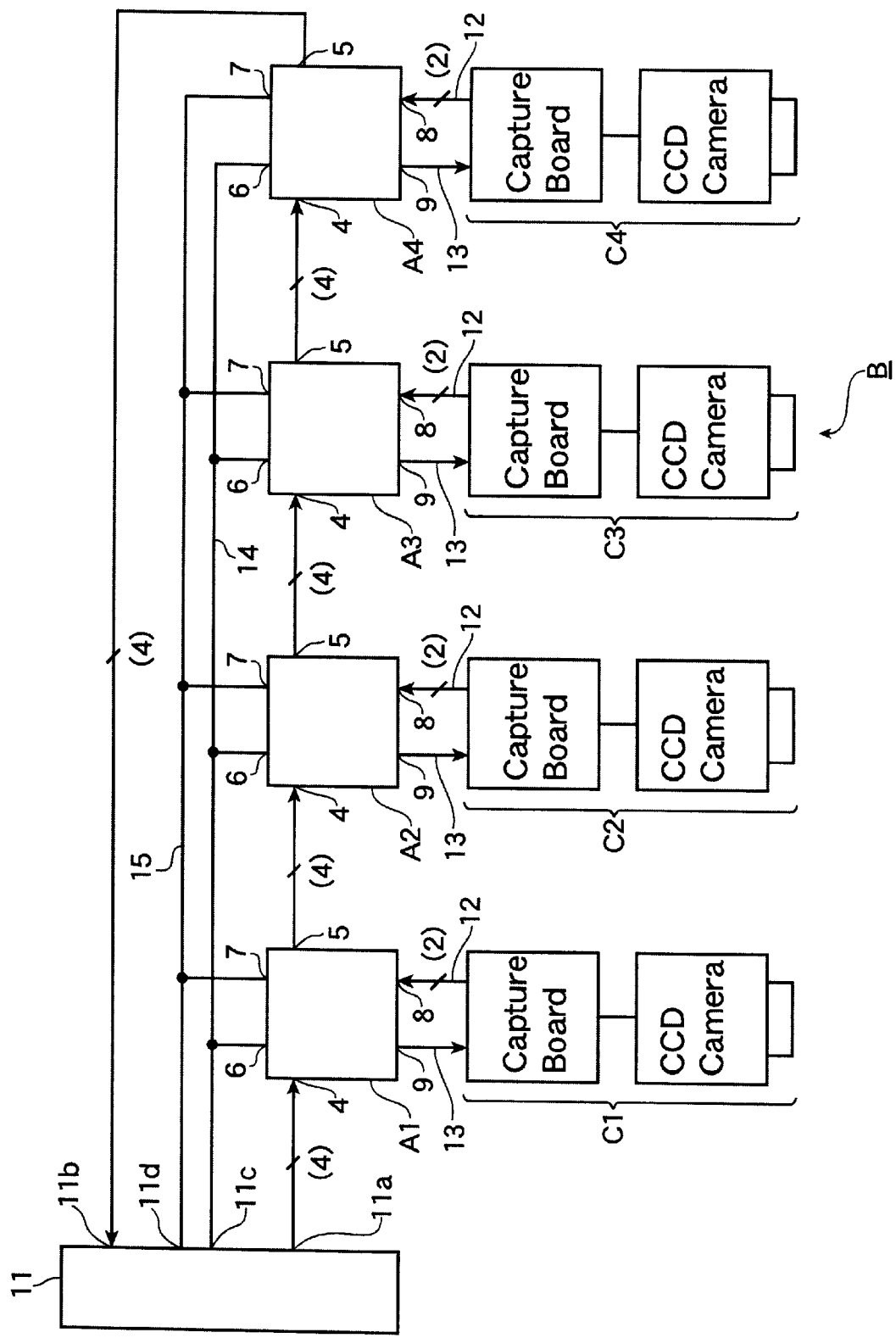
FIG. 2 is a block diagram of a communication apparatus B according to the present invention.
Figure 3:
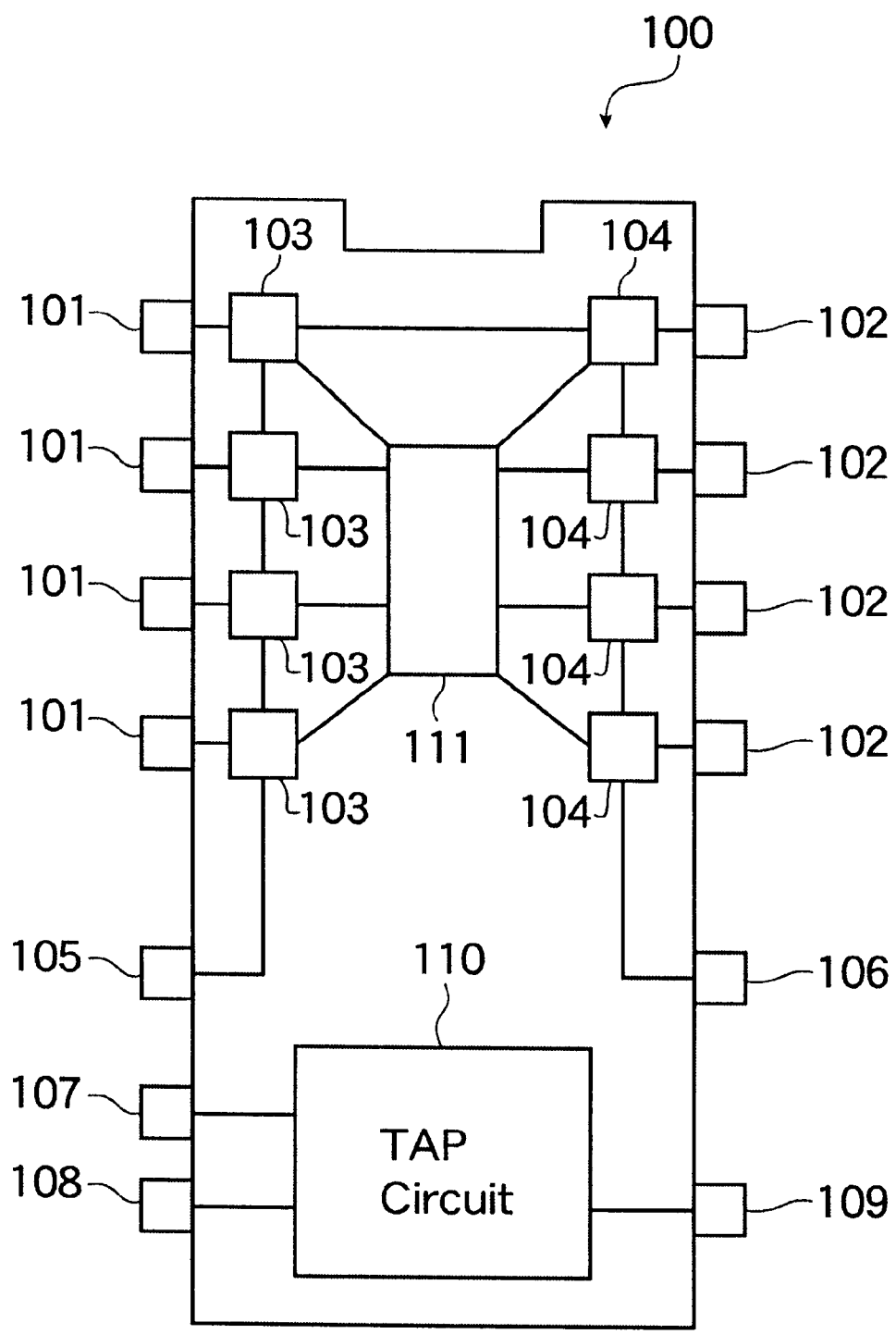
FIG. 3 is a block diagram of a conventional boundary scan element 100.

Subsequently, a communication apparatus B using the communication element A will be described. FIG. 2 is a block diagram of the communication apparatus B.

The communication apparatus B comprises a plurality of communication elements A1 to A4, image terminal equipment C1 to C4 connected to the communication elements A1 to A4, respectively, and a host computer 11. The communication apparatus B is used, e.g., as a monitoring apparatus for every floor of a building.

The communication elements A1 to A4 have the above-described constitution.

Each of the image terminal equipment C1 to C4 comprises a capture board and a CCD camera. The capture board is connected to the terminal-equipment-side input and output terminals 8 and 9 of each of the communication elements A1 to A4 through a data input line 12 and a data output line 13. The capture board is situated between the CCD camera and each of the communication elements A1 to A4. The capture board controls the CCD camera and buffers image data of the CCD camera or executes other processing. The host computer 11 comprises an output terminal 11a (4 bits) for communication data, an input terminal 11b (4 bits) for communication data, a TCK terminal 11c for sending out the clock signal and a TMS terminal 11d for sending out a TMS signal. The host computer 11 receives an instruction for the operation of the terminal equipment C1 to C4 and the image data obtained by the terminal equipment C1 to C4, and executes the processing thereof.

The communication elements A1 to A4 are connected in series to the host computer 11. Herein, the series connection means that the adjacent communication elements (A1 and A2, A2 and A3, and A3 and A4) are connected by the connection of the output terminal 5 and the input terminal 4 of one communication element (A1) at an end of the communication element A1 is connected to the output terminal 11a of the host computer 11, and the output terminal 5 of the communication element (A4) at another end is connected to the input terminal 11b of the host computer 11. The TCK terminal 6 and the TMS terminal 7 of each of the communication elements A1 to A4 are connected to the TCK terminal 11c and the TMS terminal 11d of the host computer 11 through a TCK line 14 and a TMS line 15, respectively.

Subsequently, the function of the communication apparatus B comprising such a constitution will be described.

The host computer 11 sends out the TMS signal from the TMS terminal in synchronization with the clock signal sent out from the TCK terminal 6, whereby the operation mode of the communication elements A1 and A2 is switched to the data shift operation. Then, the host computer 11 sends out predetermined data (4 bits) one after another from the output terminal 11a in synchronization with the clock signal. All of these data once enter the input-side boundary cells 1 from the input terminal 4 of the communication element A1. Then, the communication element A1 transfers the data to the output-side boundary cells 2 in synchronization with the clock signal. The communication element A1 further transfers the data from the output terminal 5 to the communication element A2.

The communication elements A2 to A4 execute the same processing in synchronization with the clock signal. Then, the communication elements A1 to A4 enter a state in which necessary data is set in the input-side boundary cells 1 of the communication elements A1 to A4.

In this state, the host computer 11 sends out the TMS signal, whereby the operation mode of the communication elements A1 to A4 is switched. Thus, the data set in the input-side boundary cells 1 is. sent out from the terminal-equipment-side output terminal 9 to the capture boards of the terminal equipment C1 to C4.

The capture boards of the terminal equipments C1 to C4 execute the processing in accordance with contents of the data which is sent out to the capture boards. For example, the capture boards start picking up the image by the CCD camera, detect the operation state of the CCD camera, buffer the image data picked up by the CCD camera or transfer the image data to the communication elements A1 to A4.

When the capture boards transfer the image data to the communication elements A1 to A4, the image data enters the communication elements A1 to A4 from the terminal-equipment-side input terminal 8 and then the image data is set in the output-side boundary cells 2.

The host computer 11 sends out the TMS signal, whereby the operation mode of the communication elements A1 to A4 is switched so as to transfer the data set in the output-side boundary cells 2. In this case, the dataset in the output-side boundary cells 2 of the communication element A4 is transferred to the host computer 11 through the output terminal 5 and the input terminal 11b in synchronization with the clock signal. At the same time, the data set in the output-side boundary cells 2 of the communication elements A1, A2 and A3 are transferred to the input-side boundary cells 1 of the communication elements A2, A3 and A4, respectively.

Then, the data transferred to the input-side boundary cells 1 are transferred to the output-side boundary cells 2 in the same communication elements in synchronization with the next clock signal.

These transfers are repeated, so that the image data of all the terminal equipment C1 to C4 are finally transferred to the host computer 11. The host computer 11 separately displays these image data and optionally executes other processing.

The communication apparatus B functions in this manner. The communication apparatus B is characterized by that the use of the communication element A allows the data to be transferred at high rate between the boundary cells 1 and 2 and between the boundary cells 1 or 2 and the host computer 11 and thus the large-capacity data can be processed.

Although the present invention has been described with reference to the preferred embodiments, it should be understood that various modifications and variations can be easily made by those skilled in the art without departing from the spirit of the invention. Accordingly, the foregoing disclosure should be interpreted as illustrative only and is not to be interpreted in a limiting sense. The present invention is limited only by the scope of the following claims.

What is claimed is:

1. A communication element comprising:

a plurality of input-side boundary cells;

a plurality of output-side boundary cells corresponding to said input-side boundary cells; and a TAP circuit for controlling input and output of data to/from said input-side and output-side boundary cells, said TAP circuit being connected to a TCK line to which a clock signal is inputted, a TMS line to which a mode signal for switching operation modes is inputted, and data input and output lines for inputting and outputting the data to/from a terminal equipment which is an object of communication, wherein said input-side boundary cells are connected in parallel to said corresponding output-side boundary cells through said TAP circuit;

said TAP circuit has at least (a) a function of transferring data stored in said input-side boundary cells to said output-side boundary cells;

(b) a function of generating data, number of bits thereof being controlled for controlling the terminal equipment or for other purposes in accordance with the data stored in the input-side boundary cells and then this data being outputted from terminal-equipment-side output terminal;

said TAP circuit executes an operation mode corresponding to said functions (a) or (b) due to an operation mode signal inputted to said TAP circuit;

said input-side boundary cells store the data to be processed in the operation mode of said TAP circuit; and said output-side boundary cells store data having been processed in the operation mode of said TAP circuit.

2. A communication element according to claim 1, wherein said plurality of input-side boundary cells is arranged independently without being connected to each other, and said plurality of output-side boundary cells is arranged independently without being connected to each other.

3. A communication apparatus comprising:

a plurality of communication elements;

a plurality of terminal equipments separately connected to each of said communication elements, for inputting and outputting data to/from said communication elements through data input and output lines; and a host computer, wherein each of said communication elements includes:

a plurality of input-side boundary cells;

a plurality of output-side boundary cells corresponding to said input-side boundary cells; and a TAP circuit for controlling input and output of data to/from said input-side and output-side boundary cells, said TAP circuit being connected to a TCK line to which a clock signal is inputted, a TMS line to which a mode signal for switching operation modes is inputted, and said data input and output lines for inputting and outputting the data to/from the terminal equipments which are objects of communication, wherein said input-side boundary cells are connected in parallel to said corresponding output-side boundary cells through said TAP circuit;

said TAP circuit has at least (a) a function of transferring data stored in said input-side boundary cells to said output-side boundary cells;

(b) a function of generating data, number of bits thereof being controlled for controlling the terminal equipment or for other purposes in accordance with the data stored in the input-side boundary cells and then this data being outputted from terminal-equipment-side output terminal;

said TAP circuit executes an operation mode corresponding to said functions (a) or (b) due to an operation mode signal inputted to said TAP circuit;

said input-side boundary cells store the data to be processed in the operation mode of said TAP circuit; and said output-side boundary cells store data having been processed in the operation mode of said TAP circuit.

4. A communication apparatus according to claim 3, wherein said plurality of input-side boundary cells is arranged independently without being connected to each other, and said plurality of output-side boundary cells is arranged independently without being connected to each other.

* * * * *